(12) United States Patent
Takashima et al.

(10) Patent No.: US 7,470,982 B2
(45) Date of Patent: Dec. 30, 2008

(54) SUBSTRATE FOR SEMICONDUCTOR DEVICE AND SEMICONDUCTOR DEVICE

(75) Inventors: Kouichi Takashima, Itami (JP); Kazuya Kamitake, Itami (JP)

(73) Assignee: A.L.M.T. Corp., Tokyo (JP)

( * ) Notice: Subject to any disclaimer, the term of this patent is extended or adjusted under 35 U.S.C. 154(b) by 84 days.

(21) Appl. No.: 10/593,819

(22) PCT Filed: Mar. 7, 2005

(86) PCT No.: PCT/JP2005/003846

§ 371 (c)(1),
(2), (4) Date: Sep. 22, 2006

(87) PCT Pub. No.: WO2005/091360

PCT Pub. Date: Sep. 29, 2005

(65) Prior Publication Data

US 2007/0194440 A1    Aug. 23, 2007

(30) Foreign Application Priority Data

Mar. 24, 2004  (JP)  ............................ 2004-085969

(51) Int. Cl.
  *H01L 23/10*  (2006.01)
  *H01L 23/34*  (2006.01)
(52) U.S. Cl. ....................................... 257/706; 257/707
(58) Field of Classification Search ................. 257/706, 257/707, 709
See application file for complete search history.

(56) References Cited

U.S. PATENT DOCUMENTS

| 4,480,013 A | 10/1984 | Doi et al. |
| 2002/0195690 A1 | 12/2002 | Fukui |
| 2006/0102373 A1* | 5/2006 | Kamitake et al. ............ 174/52.4 |

FOREIGN PATENT DOCUMENTS

| JP | 58-15241 A | 1/1983 |
| JP | 60-128625 A | 7/1985 |
| JP | 61-1948842 A | 8/1986 |

(Continued)

OTHER PUBLICATIONS

International Search Report issued in International Application No. PCT/JP2005/003846.

*Primary Examiner*—Phat X Cao
(74) *Attorney, Agent, or Firm*—McDermott Will & Emery LLP (57) ABSTRACT

A configuration for a substrate for a semiconductor device which makes it possible to achieve further stabilization of the voltage for driving a semiconductor element (5) to be mounted is provided. The substrate for a semiconductor device is provided with a base (1) and an electrically insulating film (3) formed on at least a portion of the surface of this base (1). The base (1) is made of one type of material selected from the group consisting of an alloy including copper and tungsten, an alloy including copper and molybdenum, an alloy including copper, tungsten and molybdenum, a composite material including aluminum and silicon carbide, and a composite material including silicon and silicon carbide. The electrically insulating film (3) includes plural layers made of at least one type of film selected from the group consisting of a diamond-like carbon film, an aluminum oxide film and a silicon oxide film.

8 Claims, 2 Drawing Sheets

FOREIGN PATENT DOCUMENTS

| | | |
|---|---|---|
| JP | 9-107057 A | 4/1997 |
| JP | 10-284643 A | 10/1998 |
| JP | 2000-174183 A | 6/2000 |
| JP | 2001-118960 A | 4/2001 |
| JP | 2003-7895 * | 1/2003 |
| JP | 2003-7895 A | 1/2003 |
| JP | 2004-104074 A | 4/2004 |
| WO | WO 01/69674 A1 | 9/2001 |

* cited by examiner

SUBSTRATE FOR SEMICONDUCTOR DEVICE AND SEMICONDUCTOR DEVICE

RELATED APPLICATIONS

This application is the U.S. National Phase under 35 U.S.C.§371 of International Application No. PCT/JP2005/003846, filed on Mar. 7, 2005, which in turn claims the benefit of Japanese Application No. 2004-085969, filed on Mar. 24, 2004, the disclosures of which Applications are incorporated by reference herein.

TECHNICAL FIELD

This invention generally relates to a substrate for a semiconductor device and a semiconductor device, and in particular, a substrate which is used for a heat sink, a heat releasing substrate, a housing and the like that form a semiconductor device in which a semiconductor element such as an MPU (micro processing unit) is mounted.

BACKGROUND ART

Figure 7:
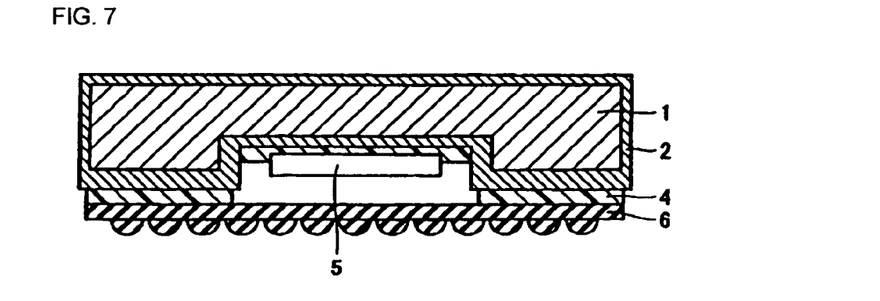
FIG. 7 is a schematic cross sectional diagram showing the structure of the cross section of a semiconductor device according to the prior art.

FIG. 7 is a schematic cross sectional diagram showing the configuration of a semiconductor device in which a conventional MPU is mounted.

As shown in FIG. 7, a nickel plating layer 2 is formed on the outer surface of a base 1 made of, for example, a copper-tungsten alloy having high thermal conductivity. A semiconductor chip 5, which is a semiconductor element, is bonded and secured to the surface of the plating layer 2 with a conductive resin layer 4 including a metal and having high thermal conductivity in between. A ceramic package 6 is placed in such a manner as to cover the semiconductor chip 5 and is bonded and secured to the surface of the plating layer 2 with the conductive resin layer 4 in between. Conventional semiconductor devices are formed in this manner.

A substrate for a semiconductor device where an thin film of an insulator of, for example, $Al_2O_3$ or diamond, is formed on a metal plate is proposed as a substrate for a semiconductor device having excellent heat releasing properties where the coefficient of thermal expansion is close to that of the semiconductor element to be mounted in Japanese Unexamined Patent Publication S58 (1983)-15241 (Patent Document 1).

In addition, a substrate on which a semiconductor element is to be mounted where an electrically insulating layer is formed of diamond, a carbon film in pseudo diamond form or a mixed substance of these on a metal substrate is proposed as a substrate on which a semiconductor element is to be mounted having low thermal resistance and only little influence on a high frequency signal in Japanese Unexamined Patent Publication S60 (1985)-128625 (Patent Document 2).

Furthermore, a substrate on which a semiconductor element is to be mounted made of a main metal plate made of a copper-tungsten alloy or a copper-molybdenum alloy and a tungsten plate or a molybdenum plate which is bonded to this plate and has an electrically insulating coating layer of, for example, $Al_2O_3$ or diamond, on at least a portion of the surface is proposed in Japanese Unexamined Patent Publication S61 (1986)-194842 (Patent Document 3) in order to solve the problems caused by pinholes and cracking which occur in the electrically insulating coating layer.

A substrate for a semiconductor device having a base made of a tungsten and/or molybdenum-copper alloy, an aluminum coating layer that is formed on the surface of the base to which a resin is to be joined, and an oxide layer having a thickness of 10 angstrom to 800 angstrom created through natural oxidation on the surface of the aluminum coating layer is proposed in Japanese Unexamined Patent Publication H10 (1998)-284643 (Patent Document 4) in order to improve the strength of joining between the substrate material made of an alloy such as copper-tungsten or copper-molybdenum and a resin.

Patent Document 1: Japanese Unexamined Patent Publication S58 (1983)-15241
Patent Document 2: Japanese Unexamined Patent Publication S60 (1985)-128625
Patent Document 3: Japanese Unexamined Patent Publication S61 (1986)-194842
Patent Document 4: Japanese Unexamined Patent Publication H10 (1998)-284643

DISCLOSURE OF THE INVENTION

Problem to be Solved by the Invention

In the semiconductor device shown in FIG. 7, further stabilization of a voltage for driving the semiconductor chip 5 is required, since the speed of the MPU is faster. However, the semiconductor chip 5 and the base 1 are bonded together with the conductive resin layer 4 in between, and therefore, a microscopic current flows from the rear surface portion of the semiconductor chip 5 through the conductive resin layer 4 and the plating layer 2 to the base 1. Therefore, the current for driving the semiconductor chip 5 flows on the base 1 side, and thereby, a problem arises, such that the driving voltage becomes unstable.

In addition, formation of various electrically insulating coating layers on the substrate has been proposed in the above described gazettes. However, in some cases, a microscopic defect is inevitably caused on the surface of the coating layer, and in such cases, a problem arises, such that it is difficult to secure the high electrical insulation required in order to achieve further stabilization of the voltage for driving the semiconductor chip as described above, when the substrate and the semiconductor chip are bonded using the conductive resin layer.

Therefore, an object of this invention is to provide a configuration for a substrate for a semiconductor device that makes it possible to achieve further stabilization of the voltage for driving the mounted semiconductor element.

Means for Solving the Problems

A substrate for a semiconductor device according to this invention is provided with a base and an electrically insulating film that is formed on at least a portion of a surface of this base. The base is made of one type of material selected from the group consisting of an alloy including copper and tungsten, an alloy including copper and molybdenum, an alloy including copper, tungsten and molybdenum, a composite material including aluminum and silicon carbide, and a composite material including silicon and silicon carbide. The electrically insulating film includes plural layers made of at least one type of film selected from the group consisting of a diamond-like carbon film, an aluminum oxide film and a silicon oxide film. Here, diamond-like carbon (DLC) means an allotrope of carbon or an amorphous hydrocarbon which includes $SP^3$ bonds of carbon which are the same as those in natural diamond, $SP^2$ bonds of carbon which are the same as those in graphite, and bonds between carbon and hydrogen.

In the substrate for a semiconductor device according to this invention, it is preferable for the thickness of the electrically insulating film to be no less than the surface roughness of the base. In this case, it is preferable for the surface roughness Rmax of the base to be no less than 0.1 μm and no more than 20 μm.

In addition, in the substrate for a semiconductor device according to this invention, it is preferable for the depth of a defective portion to be no greater than ⅔ of the thickness of the electrically insulating film.

Furthermore, in the substrate for a semiconductor device according to this invention, it is preferable for the electrically insulating film to be formed on the surface of the base on which a semiconductor element is to be mounted.

In the substrate for a semiconductor device according to this invention, it is preferable for the alloy including copper and tungsten, the alloy including copper and molybdenum and the alloy including copper, tungsten and molybdenum to include no less than 5 mass % and no more than 40 mass % of copper.

In the substrate for a semiconductor device according to this invention, it is preferable for the composite material including aluminum and silicon carbide to include no less than 20 mass % and no more than 90 mass % of aluminum.

In the substrate for a semiconductor device according to this invention, it is preferable for the composite material including silicon and silicon carbide to include no less than 10 mass % and no more than 35 mass % of silicon.

A semiconductor device according to this invention is provided with a base, an electrically insulating film that is formed on at least a portion of a surface of this base, and a semiconductor element that is bonded to the top of this electrically insulating film. The base is made of one type of material selected from the group consisting of an alloy including copper and tungsten, an alloy including copper and molybdenum, an alloy including copper, tungsten and molybdenum, a composite material including aluminum and silicon carbide, and a composite material including silicon and silicon carbide. The electrically insulating film includes plural layers made of at least one type of film selected from the group consisting of a diamond-like carbon film, an aluminum oxide film and a silicon oxide film.

Here, in this invention, the electrically insulating film may have plural layers made of two or more types of films selected from the group consisting of the diamond-like carbon film, the aluminum oxide film and the silicon oxide film.

Effects of the Invention

As described above, according to this invention, the electrically insulating film that is formed on at least a portion of the surface of the base is formed so as to include plural layers made of at least one type of film selected from the group consisting of the diamond-like carbon film, the aluminum oxide film and the silicon oxide film, and therefore, when the semiconductor element is secured to the top of this electrically insulating film, high electrical insulation can be secured between the semiconductor element and the base, and thus, it is possible to achieve further stability in the voltage for driving the mounted semiconductor element.

EXPLANATION OF THE SYMBOLS

1: base; 2: plating layer; 3: electrically insulating film: 4: conductive resin layer; 5: semiconductor chip; 6: ceramic package

BEST MODE FOR CARRYING OUT THE INVENTION

Figure 1:
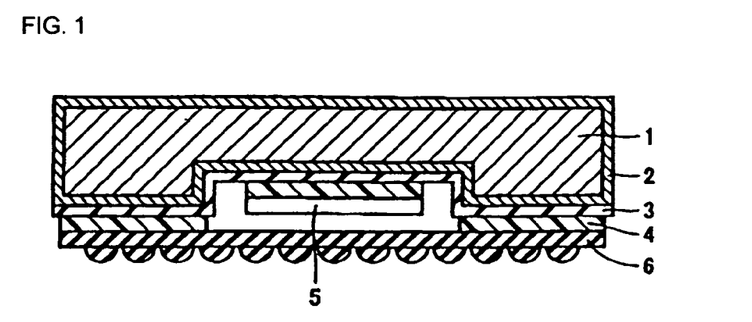
FIG. 1 is a schematic cross sectional diagram showing the structure of the cross section of a semiconductor device with a substrate for a semiconductor device according to one embodiment of this invention.

FIG. 1 is a schematic cross sectional diagram showing the structure of the cross section of a semiconductor device with a substrate for a semiconductor device according to one embodiment of this invention.

As shown in FIG. 1, a base 1 is a base for a heat sink, a heat releasing substrate, a housing and the like which form a semiconductor device, and has a recess in the center portion of one surface. The material that forms the base 1 is any of a copper-tungsten alloy, a copper-molybdenum alloy, a copper-tungsten-molybdenum alloy, a composite material where silicon carbide is dispersed in aluminum or an aluminum alloy, or a composite material where silicon carbide is dispersed in silicon or a silicon alloy. These materials have both a coefficient of thermal expansion that is close to that of the material for the semiconductor element and the package and high thermal conductivity. The coefficient of thermal expansion is preferably no higher than $13 \times 10^{-6}$/° C. and more preferably $3 \times 10^{-6}$/° C. to $8 \times 10^{-6}$/° C., so that it matches with the coefficient of thermal expansion of the semiconductor element to be mounted. The coefficient of thermal conductivity is preferably no less than 150 W/m•K and more preferably no less than 200 W/m•K. The nickel plating layer 2 is formed so as to coat the outer surface of the base 1. An electrically insulating film 3 is formed on a portion of the surface that includes the surface of the recess in the base 1, on which the plating layer 2 is formed. The electrically insulating film 3 is formed of plural layers of any of diamond-like carbon films, aluminum oxide films and silicon oxide films. A contact layer of, for example, titanium, chromium, a nickel-chromium alloy, tantalum, silicon, or a composite of these may be formed as a base layer in order to enhance the adhesiveness of the electrically insulating film 3. It is preferable for the thickness of the contact layer to be 0.01 μm to 0.1 μm. A substrate for a semiconductor device according to one embodiment of the present invention is formed in this manner.

A semiconductor chip 5 is bonded and secured to the top of the electrically insulating film 3 formed on the surface of the base 1 in the recess with a conductive resin layer 4 in between. A ceramic package 6 is placed so as to cover the semiconductor chip 5 and bonded and secured to the top of the electrically insulating film 3 formed on the surface of the base 1 with the conductive resin layer 4 in between. A plastic package may be used instead of the ceramic package 6. The semiconductor device is formed in this manner.

In the semiconductor device formed as described above, the electrically insulating film 3 formed on the surface of the base 1 in the recess where the semiconductor chip 5 is mounted is formed of plural layers made of any of diamond-like carbon films, aluminum oxide films or silicon oxide films. Therefore, high electrical insulation can be secured between the semiconductor chip 5 and the base 1. In particular, even when it is inevitable for a microscopic film defect to be caused in a surface portion of any one layer of a diamond-like carbon film, an aluminum oxide film or a silicon oxide film due to the atmosphere in which the film is formed, the substance that is adsorbed into the surface of the plating layer 2, the state of the surface of the base 1 and the like at the stage where this layer is formed on the surface of the base 1, the number of layers work so as to compensate for the film defect in a complementary manner. As a result, even when the existence of a microscopic defect is inevitable on the surface of one layer, the high electrical insulation required for achieving further stability in the voltage for driving the semiconductor chip can be secured between the semiconductor chip 5 and the base 1, if the base 1 and the semiconductor chip 1 are bonded with the conductive resin layer 4 in between.

Figure 2:
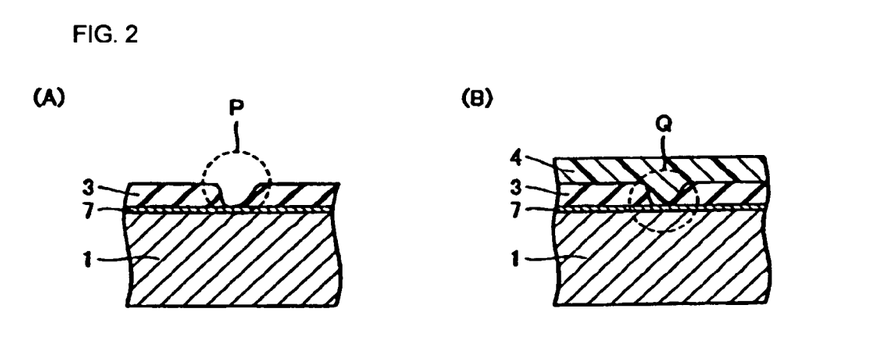
FIGS. 2(A) and 2(B) are schematic cross sectional diagrams showing the structure of the cross section of one layer of a diamond-like carbon film that is formed on the surface of a base as an electrically insulating film according to a reference example of this invention.

FIGS. 2(A) and 2(B) are schematic cross sectional diagrams showing the structure of the cross section of one layer of a diamond-like carbon film that is formed on the surface of the base as an electrically insulating film according to a reference example of this invention.

As shown in FIG. 2(A), a contact layer 7 is formed of titanium or the like as a base layer on the surface of the base 1. The electrically insulating film 3 is formed of one layer of a diamond-like carbon film on this contact layer 7. In this case, a recess P which exposes the surface of the contact layer 7 is created in a portion of the surface of the electrically insulating film 3 as a microscopic film defect resulting from the state on the surface of the base 1 or the like. As shown in FIG. 2(B), when the conductive resin layer 4 for securing a semiconductor element is formed on the electrically insulating film 3, the conductive resin layer 4 and the contact layer 7 make electrical contact, creating a portion where insulation is broken down Q through which the semiconductor element can be electrically connected to the base 1.

Figure 3:
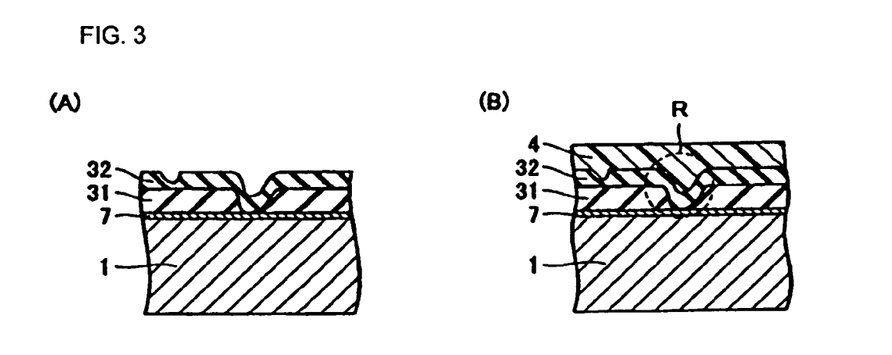
FIGS. 3(A) and 3(B) are schematic cross sectional diagrams showing the structure of the cross section of two layers of diamond-like carbon films that are formed on the surface of a base as electrically insulating films according to one embodiment of this invention.

FIGS. 3(A) and 3(B) are schematic cross sectional diagrams showing the structure of the cross section of two layers of diamond-like carbon films which are formed on the surface of the base as an electrically insulating film according to one embodiment of this invention.

As shown in FIG. 3(A), the contact layer 7 is formed of titanium or the like on the surface of the base 1 as a base layer. Insulating layers 31 and 32 are formed of two layers of diamond-like carbon films on this contact layer 7. In this case, even when a recess which exposes the surface of the contact layer 7 is created in a portion of the surface of the insulating layer 31 as a microscopic film defect as a result of the state on the surface of the base 1 or the like, the insulating layer 32 that is formed on the insulating layer 31 fills in and compensates for the recess. In addition, even when a recess is created in another portion on the surface of the insulating layer 32 as a microscopic film defect, the existence of the insulating layer 31 prevents the surface of the contact layer 7 from being exposed. Therefore, as shown in FIG. 3(B), when the conductive resin layer 4 is formed in order to secure a semiconductor element to the top of the insulating layer 32, the conductive resin layer 4 and the contact layer 7 do not make electrical contact, and an insulating portion R which works to prevent the semiconductor element from being electrically connected to the base 1 is formed.

Figure 4:
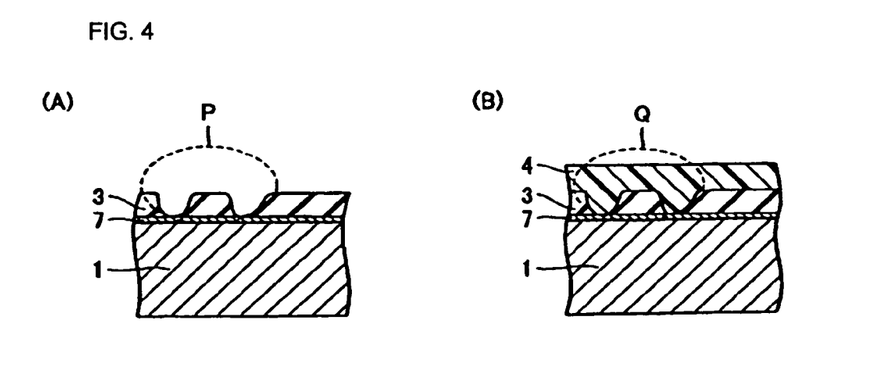
FIGS. 4(A) and 4(B) are schematic cross sectional diagrams showing the structure of the cross section of one layer of a diamond-like carbon film that is formed on the surface of a base as an electrically insulating film according to another reference example of this invention.

FIGS. 4(A) and 4(B) are schematic cross sectional diagrams showing the structure of the cross section of one layer of a diamond-like carbon film which is formed on the surface of the base as an electrically insulating film according to another reference example of this invention.

As shown in FIG. 4(A), the contact layer 7 made of titanium or the like is formed on the surface of the base 1 as a base layer. The electrically insulating film 3 is formed of one layer of a diamond-like carbon film on this contact layer 7. In this case, two recesses P which expose the surface of the contact layer 7 are created in portions on the surface of the electrically insulating film 3 as microscopic film defects resulting from the state on the surface of the base 1 or the like. As shown in FIG. 4(B), when the conductive resin layer 4 is formed so as to secure a semiconductor element to the top of the electrically insulating film 3, the conductive resin layer 4 and the contact layer 7 make electrical contact, creating a portion where insulation is broken down Q through which the semiconductor element can be electrically connected to the base 1.

Figure 5:
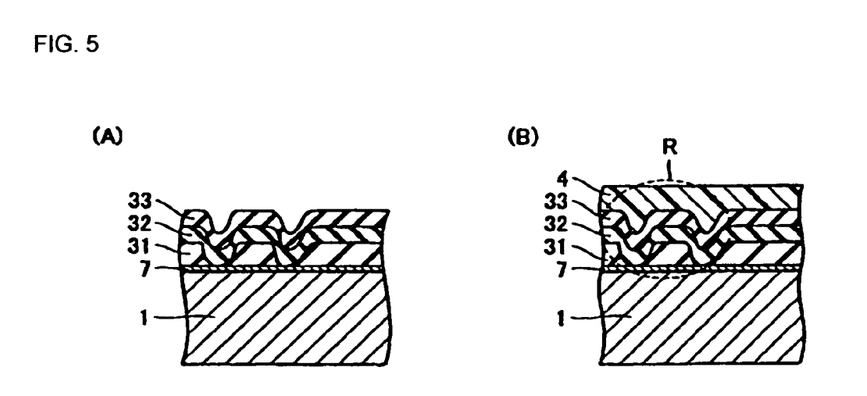
FIGS. 5(A) and 5(B) are schematic cross sectional diagrams showing the structure of the cross section of three layers of diamond-like carbon films that are formed on the surface of a base as electrically insulating films according to another embodiment of this invention.

FIGS. 5(A) and 5(B) are schematic cross sectional diagrams showing the structure of the cross section of there layers of diamond-like carbon films which are formed on the surface of the base as an electrically insulating film according to another embodiment of this invention.

As shown in FIG. 5(A), the contact layer 7 is formed of titanium or the like on the surface of the base 1 as a base layer. The insulating layers 31, 32 and 33 are formed of three layers of diamond-like carbon films on this contact layer 7. In this case, even when two recesses which expose the surface of the contact layer 7 are created in portions on the surface of the insulating layer 31 as microscopic film defects resulting from the state on the surface of the base 1 or the like, the insulating layers 32 and 33 which are formed on the insulating layer 31 fill in and compensate for the recesses. Therefore, as shown in FIG. 5(B), when the conductive resin layer 4 is formed in order to secure a semiconductor element to the top of the insulating layer 33, the conductive resin layer 4 and the contact layer 7 do not make electrical contact, and the insulating portion R which works to prevent the semiconductor element from being electrically connected to the base 1 is formed.

The above described working effects can be gained by forming plural layers of either aluminum oxide films or silicon oxide films instead of the diamond-like carbon films as the electrically insulating film 3, and in addition, can be gained when the contact layer 7 is not formed. In addition, the same effects can be gained in the case where the film defects are cracks or microscopic cracks.

In a substrate for a semiconductor device according to the embodiment of the present invention which is formed as described above, in the case where the material that forms the base 1 is one of a copper-tungsten alloy, a copper-molybdenum alloy or a copper-tungsten-molybdenum alloy containing copper in a range of 5 mass % to 40 mass %, a composite material containing aluminum in a range of 20 mass % to 90 mass % where silicon carbide is dispersed in aluminum or an aluminum alloy or a composite material containing silicon in a range of 10 mass % to 35 mass % where silicon carbide is dispersed in silicon or a silicon alloy, the coefficient of thermal expansion preferably matches that of the mounted semiconductor chip 5, and heat release from the semiconductor chip 5 can be enhanced.

In the case where the content of copper is in range of 5 mass % to 40 mass %, the coefficient of thermal expansion of the copper-tungsten alloy is approximately $5 \times 10^{-6}/°$ C. to $12 \times 10^{-6}/°$ C. Compared to this, the coefficient of thermal expansion of silicon, germanium, gallium-arsenic or the like that forms widely used semiconductor chips is approximately $3 \times 10^{-6}/°$ C. to $4 \times 10^{-6}/°$ C. In addition, the coefficient of thermal expansion of the material that forms widely used ceramic packages is approximately $4 \times 10^{-6}/°$ C. to $10 \times 10^{-6}/°$ C. Judging from the relationship between these coefficients of thermal expansion, it is preferable for the content of copper to be in a range of 5 mass % to 40 mass %.

In the case where the content of copper is less than 5 mass %, the coefficient of thermal expansion of the copper-tungsten alloy becomes small, and therefore, when this is joined to a ceramic package made of aluminum oxide or a semiconductor chip made of silicon, a problem arises, such that the substrate bends due to the difference in the coefficient of thermal expansion, or the semiconductor chip warps. In the case where the content of copper exceeds 40 mass %, the coefficient of thermal expansion of the copper-tungsten alloy becomes great, and therefore, when this is joined to a ceramic package made of aluminum oxide or a semiconductor chip made of silicon, a problem arises, such that the substrate bends due to the difference in the coefficient of thermal expansion, or the semiconductor chip warps. Thus, it is preferable for the content of copper to be in a range of 7 mass % to 20 mass %.

In the case where the content of aluminum is in a range of 20 mass % to 90 mass %, the coefficient of thermal expansion of the composite material where silicon carbide is dispersed in aluminum or an aluminum alloy is approximately $8 \times 10^{-6}/°$ C. to $20 \times 10^{-6}/°$ C. Compared to this, the coefficient of thermal expansion of silicon, germanium, gallium-arsenic or the like that forms widely used semiconductor chips is approximately $3 \times 10^{-6}/°$ C. to $4 \times 10^{-6}/°$ C. In addition, the coefficient of thermal expansion of the material that forms widely used plastic packages is approximately $7 \times 10^{-6}/°$ C. to $13 \times 10^{-6}/°$ C. Judging from the relationship between these coefficients of thermal expansion, it is preferable for the content of aluminum to be in a range of 20 mass % to 90 mass %.

In the case where the content of aluminum is less than 20 mass %, the relative amount of aluminum becomes small, and therefore, it becomes difficult to increase the density of the composite material. In the case where the content of aluminum exceeds 90 mass %, the coefficient of thermal expansion of the composite material becomes large, and therefore, a problem arises, such that the substrate bends due to the difference in the coefficient of thermal expansion when joined to a plastic package. It is preferable for the content of aluminum to be in a range of 40 mass % to 70 mass %.

In the case where the content of silicon is in a range of 10 mass % to 35 mass %, the coefficient of thermal expansion of the composite material where silicon carbide is dispersed in silicon or a silicon alloy is no higher than $5 \times 10^{-6}$ and the thermal conductivity is no less than 200 W/m•K. Compared to this, the coefficient of thermal expansion of silicon, germanium, gallium-arsenic or the like that forms widely used semiconductor chips is approximately $3 \times 10^{-6}/°$ C. to $4 \times 10^{-6}/°$ C. In addition, the coefficient of thermal expansion of the material that forms widely used ceramic packages is approximately $4 \times 10^{-6}/°$ C. to $10 \times 10^{-6}/°$ C. Judging from the relationship between these coefficients of thermal expansion, it is preferable for the content of silicon to be in a range of 10 mass % to 35 mass %. In addition, unless the content of silicon is in this range, the manufacture of a composite material where silicon carbide is dispersed in silicon or a silicon alloy becomes difficult.

In the case where the content of silicon is less than 10 mass %, it is difficult to impregnate the material with silicon in accordance with a liquid metal infiltration method, and bubbles are easily created in the composite material, and the thermal conductivity of the composite material becomes low. In the case where the content of silicon exceeds 35 mass %, the physical strength of the body molded from silicon carbide before the liquid infiltration of silicon becomes low, and therefore, it becomes difficult to handle the composite material, and the manufacture thereof becomes difficult. In addition, the content of silicon carbide becomes low, and therefore, the thermal conductivity of the composite material becomes low. Thus, it is preferable for the content of silicon to be in a range of 15 mass % to 25 mass %.

In the above described embodiment, it is preferable for the thickness of the electrically insulating film 3 to be no less than the surface roughness (Rmax) on the surface of the base 1. In the case where the thickness of the electrically insulating film 3 is less than the surface roughness of the base 1, the thickness of the electrically insulating film 3 becomes small in some parts, and thus, high electrical insulation cannot be secured. It is preferable for the thickness of the electrically insulating film 3 to be no less than two times thicker than the surface roughness of the base 1.

It is preferable for the surface roughness Rmax of the base 1 to be in a range of 0.1 μm to 20 μm. In the case where the surface roughness Rmax of the base 1 exceeds 20 μm, the thickness of the electrically insulating film 3 which is formed on the surface of the base 1 becomes uneven, and portions of a small thickness are created, or pinholes are created in the electrically insulating film 3, and therefore, high electrical insulation cannot be secured. In addition, in this case, a gap is easily created between the conductive resin layer 4 and the surface of the plating layer 2 at the time of formation of the conductive resin layer 4, and thus, the strength in the joining between the conductive resin layer 4 and the base 1 becomes highly uneven. In the case where the surface roughness Rmax of the base 1 is less than 0.1 μm, it becomes difficult to gain sufficient anchor effects at the time of formation of the conductive resin layer 4, and therefore, the adhesiveness between the conductive resin layer 4 and the base 1 becomes low. It is preferable for the surface roughness Rmax of the base 1 to be in a range of 0.1 μm to 8 μm.

It is preferable for no defect to exist in the electrically insulating film 3. In the case where the electrically insulating film 3 has a defective portion, it is preferable for the depth of the defective portion to be no greater than ⅔ of the thickness of the electrically insulating film 3. In the case where the depth of the defective portion exceeds ⅔ of the thickness of the electrically insulating film 3, the thickness of the electrically insulating film 3 becomes thin in some parts, and parts where high electrical insulation cannot be secured are created.

The electrically insulating film 3 is formed of plural layers, and it is preferable for it to be formed of two to four layers. In the case where the number of layers exceeds 5, the number of steps for forming the film becomes great, and the cost for film formation increases, reducing the productivity. It is preferable for the electrically insulating film 3 to be formed of three or four layers.

It is preferable for the diamond-like carbon film which forms the electrically insulating film 3 to be formed in accordance with a CVD method, a sputtering method or the like. It is preferable for the aluminum oxide film to be formed in accordance with a method for carrying out an anodizing process or the like after vapor deposition of aluminum. It is preferable for the silicon oxide film to be formed in accordance with a CVD method or the like.

Here, the electrically insulating film 3 may have plural layers made of two or more types of films selected from the group consisting of diamond-like carbon films, aluminum oxide films and silicon oxide films.

EXAMPLES

Figure 6:
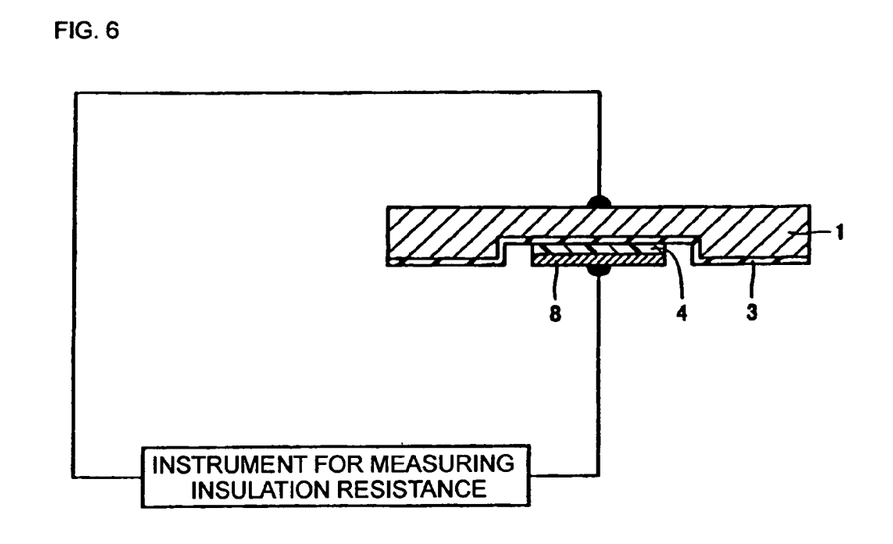
FIG. 6 is a schematic diagram schematically illustrating a method for evaluating the electrical insulation of a substrate for a semiconductor device according to an example of this invention.

The electrically insulating film 3 was formed on the surface of the base 1, as shown in FIG. 6, under the conditions shown in Tables 1 and 2 (the surface roughness Rmax of the base, the material quality of the electrically insulating film, the film thickness per layer, the number of layers, the total film thickness and the depth of defects), and thereby, substrates for a semiconductor device of Experiment Example Nos. 1 to 36 were fabricated.

Square plates having a thickness of 1.5 mm and a side of 41 mm were used as the bases. As for the base material, a tungsten-copper alloy containing 90 mass % of tungsten and 10 mass % of copper was used in Experiment Examples 1 to 6 and 11 to 18, a tungsten-copper alloy containing 95 mass % of tungsten and 5 mass % of copper was used in Experiment Example 7, a tungsten-copper alloy containing 85 mass % of tungsten and 15 mass % of copper was used in Experiment Example 8, a tungsten-copper alloy containing 80 mass % of tungsten and 20 mass % of copper was used in Experiment Example 9, a tungsten-copper alloy containing 60 mass % of tungsten and 40 mass % of copper was used in Experiment Example 10, a molybdenum-copper alloy containing 85 mass % of molybdenum and 15 mass % of copper was used in Experiment Examples 19 to 24, a composite material where 70 mass % of silicon carbide was dispersed in 30 mass % of aluminum was used in Experiment Examples 25 to 30 and a composite material where 80 mass % of silicon carbide was dispersed in 20 mass % of silicon was used in Experiment Examples 31 to 36.

For example, a base of a tungsten-copper alloy containing 90 mass % of tungsten and 10 mass % of copper was manufactured and prepared in accordance with the following liquid metal infiltration method.

0.2 mass % of a nickel powder was added to and mixed with a tungsten powder of which the average particle size was 5 μm. This mixed powder was put into a stirring mixer, to which 1 mass %, relative to the total mass, of an acryl based binder was added, and furthermore, alcohol was used as a medium for mixture which was mixed for one hour and thus secondary particles, of which the average particle size was approximately 100 μm, were fabricated. This powder was molded in a powder press so that a mold in square plate form having a thickness of 2 mm and a side of 46 mm was fabricated. The gained mold was heated for one hour at a temperature of 400° C. in a hydrogen flow, and subsequently heated for one hour at a temperature of 900° C. so that the binder component was removed. Next, the mold was sintered at a temperature of 1300° C. in a hydrogen flow. A copper plate of which the volume was sufficient for filling in the voids of the gained sintered body was fabricated and then was heated to a temperature of 1200° C. in a hydrogen flow in a state where the sintered body was placed on this copper plate, and thus, a tungsten-copper alloy containing 90 mass % of tungsten and 10 mass % of copper was gained. Excessive copper which adhered to the upper and lower surfaces and the outer surface of the alloy was removed in a polishing process, a milling process or an NC process, and at the same time, the alloy was processed so that the surface roughness Rmax became 3 μm, 5 μm, 10 μm or 20 μm, and thus, a base, in square plate form having a thickness of 1.5 mm and a side of 41 mm, and having a recess in the center portion on one surface, was gained. Furthermore, a nickel layer, having a thickness of 2 μm, was formed on the surface of the base by means of electrolytic or electroless nickel plating in order to provide anticorrosive properties, and thus, a base sample was gained.

The composite material where silicon carbide was dispersed in aluminum was manufactured and prepared in accordance with the following sintering method.

An aluminum powder of which the average particle size was 25 μm and a silicon carbide power of which the average particle size was 50 μm were mixed in a ratio where silicon carbide was 70 mass % and the mixture was put into a stirring mixer and mixed for one hour so that an aluminum silicon carbide material powder was gained. The gained material powder was molded in a powder press using a die having a sample form, and thus, a mold in square plate form, having a thickness of 1.5 mm and a side of 41 mm, and having a recess in the center portion of one surface, was fabricated. This mold was sintered for two hours at a temperature of 700° C. in a nitrogen flow, and thereby, a composite material where 70 mass % of silicon carbide was dispersed in 30 mass % of aluminum, was gained and the surface of the composite material was processed in accordance with a blasting process so that the surface roughness Rmax became 3 μm, and thus, a base in square plate form, having a thickness of 1.5 mm and a side of 41 mm, and having a recess in the center portion on one surface, was fabricated.

The composite material where silicon carbide was dispersed in silicon was manufactured and prepared in accordance with the following liquid metal infiltration method.

3%, relative to the total mass, of a paraffin binder was added to a powder where silicon carbide powders, of which the average particle sizes were 70 μm and 5 μm, respectively, were mixed in a mass ratio of 3:1, and the resulting mixture was mixed in ethanol using a ball mill. The gained slurry was sprayed, dried, granulated and molded in a powder press using a die in sample form, and thus a mold in square plate form, having a thickness of 2.0 mm and a side of 41 mm, and having a recess in the center portion on one surface, was fabricated. The gained mold was heated to a temperature of 400° C. in a vacuum under a pressure of 1.33 Pa ($1 \times 10^{-2}$ Torr) so that the binder was removed. Furthermore, this mold was pre-sintered in a vacuum for one hour at a temperature of 1600° C. and thus a pre-sintered body was fabricated. Next, a silicon powder of which the average particle size was 3 μm was molded into a square plate form having a thickness of 1 mm and a side of 42 mm in a powder press and a liquid metal infiltrating agent was prepared. Ethanol, into which a titanium nitride powder was dispersed, was applied to the entire surface, excluding the surfaces of the pre-sintered body, with which the liquid metal infiltrating agent was made to make contact in the following process (the surface having a recess and the surface on the opposite side), and after that, the pre-sintered body was dried so that a layer of an elution preventing agent was formed of the titanium nitride powder. After that, the liquid metal infiltrating agent was made to make contact with the surface of the pre-sintered body where no layer of the elution preventing agent had been formed, and liquid metal infiltration was carried out at a temperature of 1600° C. in an argon gas atmosphere. After the liquid metal infiltration, the melted metal is eluted only from the surface with which the liquid metal infiltrating agent was made to make contact, without eluting from the surface to which the elution preventing agent was applied, and thereby, a composite material where 80 mass % of silicon carbide was dispersed in 20 mass % of silicon was gained. The elution preventing agent was removed in accordance with a blasting process, and the eluted substance was removed in accordance with a polishing process, and at the same time, the surface of the composite material was processed so that the surface roughness Rmax became 3 μm, and thus, a base in square plate form having a thickness of 1.5 mm and a side of 41 mm, and having a recess in the center portion on one surface, was fabricated.

An aluminum oxide ($Al_2O_3$) film, which composed an electrically insulating film, was formed on the surface of the base by carrying out an anodizing process after the vapor deposition of aluminum under the following conditions.

A vapor deposition unit was used, the temperature of the base was set at 250° C. and argon bombarding was carried out on the surface of the base for 20 minutes in a vacuum under a pressure of 13.3 Pa (0.1 Torr), and subsequently, an aluminum vapor deposition film was formed on the surface of the base in a vacuum under a pressure of $6.65 \times 10^{-3}$ Pa ($5 \times 10^{-5}$ Torr). Next, an aluminum oxide film was generated in an electrolytic solution of 17 mass % of sulfuric acid under the conditions of a temperature of 20° C. and a current density of 100 $A/m^2$, and after that, was immersed in boiling water so that a pore sealing process was carried out. In addition, the above described process was repeated, and layered aluminum oxide films were formed.

A diamond-like carbon (DLC) film composing an electrically insulating film was formed on the surface of the base in accordance with a plasma CVD method under the following conditions. Here, in the case of the formation of a DLC film, a titanium film having a thickness of 0.1 μm had been formed in advance as a base layer in accordance with a sputtering method on the surface of the base.

The surface of the base was washed with an organic substance using ultrasonic waves, and after that, the base was attached to a plasma CVD unit, and furthermore, the deposited substance on the surface of the base was removed by means of nitrogen blowing. Air within the chamber of the plasma CVD unit was discharged until the pressure became $2 \times 10^{-3}$ Pa, and argon bombarding was carried out on the surface of the base for 20 minutes in a state where the base was heated to a temperature of 200° C., and after that, a titanium film having a thickness of 0.1 μm was formed on the surface of the base by means of sputtering. Subsequently, an acetylene gas was supplied into the chamber at a flow rate of $3 \times 10^{-4}$ $m^3$/min (300 cc/min), and thus, a DLC film was formed. The base on which the DLC film was formed was cooled, and after that, a gas removing process was carried out. In addition, the above described process, from the nitrogen blowing to the gas removing process, was repeated, and layered DLC films were formed.

A silicon oxide ($SiO_2$) film, which composed an electrically insulating film, was formed on the surface of the base in accordance with a plasma CVD method under the following conditions.

The surface of the base was washed with an organic substance using ultrasonic waves, and after that, the base was attached to a plasma CVD unit, and furthermore, the deposited substance on the surface of the base was removed by means of nitrogen blowing. Air within the chamber of the plasma CVD unit was discharged until the pressure became $1 \times 10^{-1}$ Pa, and a TEOS (Tetra-ethoxy Silane: $Si(OC_2H_5)_4$) gas was supplied at a flow rate of $3 \times 10^{-5}$ $m^3$/min (30 cc/min), and an oxygen gas was supplied at a flow rate of $9 \times 10^{-4}$ $m^3$/min (900 cc/min) into the chamber in a state where the base was heated to a temperature of 350° C. so that a silicon oxide film was formed. The base on which the silicon oxide film was formed was cooled, and after that, a gas removing process was carried out. In addition, the above described process, from the nitrogen blowing to the gas removing process, was repeated, and layered silicon oxide films were formed.

TABLE 1

| Experiment Example No. | Surface roughness Rmax of base (μm) | Insulating film | | | | Evaluation of electrical insulation |
| --- | --- | --- | --- | --- | --- | --- |
| | | Material | Film thickness (μm/layer) | Number of layers | Total film thickness (μm) | Depth of defects (μm) |
| 1 | 3 | $Al_2O_3$ | 1 | 1 | 1 | 1 | 4/30 |
| 2 | 3 | $Al_2O_3$ | 2 | 1 | 2 | 2 | 15/30 |
| 3 | 3 | $Al_2O_3$ | 3 | 1 | 3 | 3 | 17/30 |
| 4 | 3 | $Al_2O_3$ | 1 | 2 | 2 | 2 | 25/30 |
| 5 | 3 | $Al_2O_3$ | 1 | 3 | 3 | 2 | 30/30 |
| 6 | 3 | $Al_2O_3$ | 3 | 2 | 6 | 2 | 30/30 |
| 7 | 3 | $Al_2O_3$ | 1 | 3 | 3 | 2 | 30/30 |
| 8 | 3 | $Al_2O_3$ | 1 | 3 | 3 | 1 | 30/30 |
| 9 | 3 | $Al_2O_3$ | 1 | 3 | 3 | 1 | 30/30 |
| 10 | 3 | $Al_2O_3$ | 1 | 3 | 3 | 2 | 30/30 |
| 11 | 5 | $Al_2O_3$ | 1 | 3 | 3 | 3 | 17/30 |
| 12 | 5 | $Al_2O_3$ | 3 | 3 | 9 | 2 | 30/30 |
| 13 | 10 | $Al_2O_3$ | 5 | 4 | 20 | 10 | 30/30 |
| 14 | 20 | $Al_2O_3$ | 5 | 4 | 20 | 20 | 25/30 |
| 15 | 3 | DLC | 2 | 1 | 2 | 2 | 19/30 |
| 16 | 3 | DLC | 1 | 3 | 3 | 2 | 30/30 |
| 17 | 3 | $SiO_2$ | 2 | 1 | 2 | 2 | 23/30 |
| 18 | 3 | $SiO_2$ | 1 | 3 | 3 | 2 | 30/30 |

TABLE 2

| Experiment Example No. | Surface roughness Rmax of base (μm) | Insulating film | | | | Evaluation of electrical insulation |
|---|---|---|---|---|---|---|
| | | Material | Film thickness (μm/layer) | Number of layers | Total film thickness (μm) | Depth of defects (μm) | |

| Experiment Example No. | Surface roughness Rmax of base (μm) | Material | Film thickness (μm/layer) | Number of layers | Total film thickness (μm) | Depth of defects (μm) | Evaluation of electrical insulation |
|---|---|---|---|---|---|---|---|
| 19 | 3 | $Al_2O_3$ | 2 | 1 | 2 | 2 | 21/30 |
| 20 | 3 | $Al_2O_3$ | 1 | 3 | 3 | 2 | 30/30 |
| 21 | 3 | DLC | 2 | 1 | 2 | 2 | 19/30 |
| 22 | 3 | DLC | 1 | 3 | 3 | 2 | 30/30 |
| 23 | 3 | $SiO_2$ | 2 | 1 | 2 | 2 | 21/30 |
| 24 | 3 | $SiO_2$ | 1 | 3 | 3 | 2 | 30/30 |
| 25 | 3 | $Al_2O_3$ | 1 | 2 | 2 | 2 | 28/30 |
| 26 | 3 | $Al_2O_3$ | 1 | 3 | 3 | 2 | 30/30 |
| 27 | 3 | DLC | 1 | 2 | 2 | 2 | 15/30 |
| 28 | 3 | DLC | 1 | 3 | 3 | 2 | 30/30 |
| 29 | 3 | $SiO_2$ | 1 | 2 | 2 | 2 | 27/30 |
| 30 | 3 | $SiO_2$ | 1 | 3 | 3 | 2 | 30/30 |
| 31 | 3 | $Al_2O_3$ | 2 | 1 | 2 | 2 | 18/30 |
| 32 | 3 | $Al_2O_3$ | 2 | 3 | 6 | 2 | 30/30 |
| 33 | 3 | DLC | 2 | 1 | 2 | 2 | 20/30 |
| 34 | 3 | DLC | 2 | 3 | 6 | 2 | 30/30 |
| 35 | 3 | $SiO_2$ | 2 | 1 | 2 | 2 | 23/30 |
| 36 | 3 | $SiO_2$ | 2 | 3 | 6 | 2 | 30/30 |

The electrical insulation of the bases for a semiconductor device that were fabricated as described above was evaluated.

FIG. 6 is a schematic diagram schematically illustrating the method for evaluating the electrical insulation of a substrate for a semiconductor device. As shown in FIG. 6, a conductive metal plate 8 was bonded and secured to the top of the electrically insulating film 3 that was formed on the surface of the base 1 with the conductive resin layer 4 in-between. The composition of the used conductive resin layer 4 was a thermo setting resin having silver fillers in it. The material of the used conductive metal plate 8 was copper. A voltage was applied between the base 1 and the conductive metal plate 8, and the insulation breakdown voltage was measured using an instrument for measuring insulation resistance. As a result, substrates which exhibited a value of no less than 2 V of insulation breakdown voltage were categorized as good products. The "evaluation of electrical insulation" in Tables 1 and 2 indicates the ratio of good products to the number of the measured samples.

It can be seen from the results shown in Tables 1 and 2 that the electrical insulation was highly evaluated in the experiment examples where an insulating film made of plural layers was formed in comparison with the experiment examples where an insulating film made of one layer was formed. In addition, it can be seen that the electrical insulation was more highly evaluated in the experiment examples where an insulating film having a total film thickness that was no smaller than the surface roughness of the substrate was formed from among the experiment examples where an insulating film made of plural layers was formed. Furthermore, it can be seen that the electrical insulation was more highly evaluated in the experiment examples where the depth of defects was no greater than 2/3 of the total film thickness of the insulating film from among the experiment examples where an insulating film made of plural layers was formed.

The embodiments and examples disclosed in the above are illustrative in all respects, and should not be considered as being limitative. The scope of the present invention is not defined by the above described embodiments and examples but by the claims, and includes meanings equivalent to the claims and all modifications and variations within the scope.

INDUSTRIAL APPLICABILITY

The substrate for a semiconductor device of this invention is used for a heat sink, a heat releasing substrate, a housing and the like which form a semiconductor device in which a semiconductor element such as an MPU (micro processing unit) is mounted.

The invention claimed is:

1. A substrate for a semiconductor device, comprising:
a base made of one type of material selected from the group consisting of an alloy including copper and tungsten, an alloy including copper and molybdenum, an alloy including copper, tungsten and molybdenum, a composite material including aluminum and silicon carbide and a composite material including silicon and silicon carbide; and
an electrically insulating film formed on at least a portion of a surface of said base wherein,
said electrically insulating film includes plural layers made of one type of film selected from the group consisting of a diamond-like carbon film, an aluminum oxide film and a silicon oxide film; and
the thickness of said electrically insulting film is no less than 3/2 of the depth of a defective portion included in the electrically insulting film.

2. The substrate for a semiconductor device according to claim 1, wherein the thickness of said electrically insulating film is no smaller than a surface roughness of said base.

3. The substrate for a semiconductor device according to claim 2, wherein the surface roughness Rmax of said base is no smaller than 0.1 μm and no greater than 20 μm.

4. The substrate for a semiconductor device according to claim 1, wherein said electrically insulating film is formed on the surface of said base on which a semiconductor element is to be mounted.

5. The substrate for a semiconductor device according to claim 1, wherein said alloy including copper and tungsten, said alloy including copper and molybdenum, and said alloy including copper, tungsten and molybdenum include no less than 5 mass % and no more than 40 mass % of copper.

6. The substrate for a semiconductor device according to claim 1, wherein said composite material including aluminum and silicon carbide includes no less than 20 mass % and no more than 90 mass % of aluminum.

7. The substrate for a semiconductor device according to claim 1, wherein said composite material including silicon and silicon carbide includes no less than 10 mass % and no more than 35 mass % of silicon.

8. A semiconductor device, comprising:
a base made of one type of material selected from the group consisting of an alloy including copper and tungsten, an alloy including copper and molybdenum, an alloy including copper, tungsten and molybdenum, a composite material including aluminum and silicon carbide and a composite material including silicon and silicon carbide;
an electrically insulating film formed on at least a portion of a surface of said base ; and
a semiconductor element bonded to the top of said electrically insulating film, wherein
said electrically insulating film includes plural layers made of one type of film selected from the group consisting of a diamond-like carbon film, an aluminum oxide film and a silicon oxide film, and
the thickness of said electrically insulting is no less than $3/20$ of the depth of a defective portion included in the electrically insulating film.

\* \* \* \* \*